United States Patent [19]
Pati et al.

[11] Patent Number: 5,527,645
[45] Date of Patent: Jun. 18, 1996

[54] SYSTEMATIC METHOD FOR PRODUCTION OF PHASE-SHIFTING PHOTOLITHOGRAPHIC MASKS

[76] Inventors: Yagyensh C. Pati, 1199 Cleveland St., Redwood City, Calif. 94061; Thomas Kailath, 1024 Cathcart Way, Stanford, Calif. 94305

[21] Appl. No.: 340,811

[22] Filed: Nov. 17, 1994

Related U.S. Application Data

[63] Continuation of Ser. No. 51,076, Apr. 21, 1993, abandoned.
[51] Int. Cl.$^6$ ........................................ G03F 9/00
[52] U.S. Cl. ................. 430/5; 430/22; 430/321; 430/322
[58] Field of Search .................. 430/5, 22, 321, 430/322

[56] References Cited

U.S. PATENT DOCUMENTS 5,326,659  7/1994  Liu et al. ........................... 430/5

OTHER PUBLICATIONS

Modeling Phase Shifting Masks, Neureuther Andrew R., BACUS Symposium Paper, (Sep. 26, 1990).

*Primary Examiner*—S. Rosasco
*Attorney, Agent, or Firm*—Flehr, Hohbach, Test, Albritton & Herbert

[57] ABSTRACT

A systematic method of producing a mask for use within a photolithographic illumination system characterized by a transmission function in which light is transmitted through non-opaque portions of the mask positioned in an object plane and in which an image is formed on an image plane is disclosed herein. The method includes the steps of defining a binary image pattern to be formed by the illumination system on the image plane; generating a continuous mask function of continuously-varying phase which satisfies predetermined error criteria based on the transmission function and the binary image pattern; transforming the mask function into a quadrature-phase mask function by dividing the continuously-varying phase into four phase levels; and generating the mask in accordance with the quadrature-phase mask function, wherein the mask includes a plurality of pixel regions each of which has a transmittance corresponding to one of the four phase levels.

13 Claims, 7 Drawing Sheets

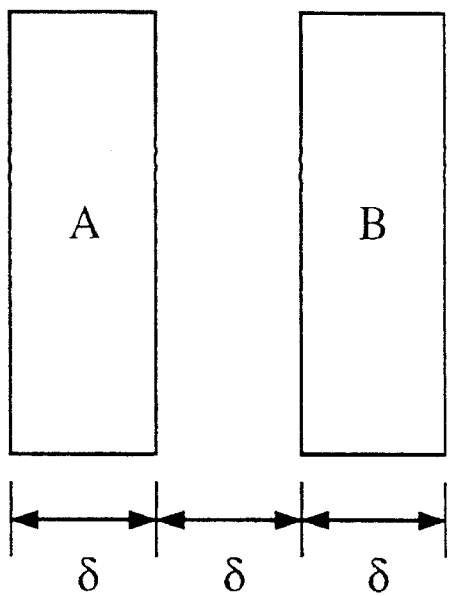
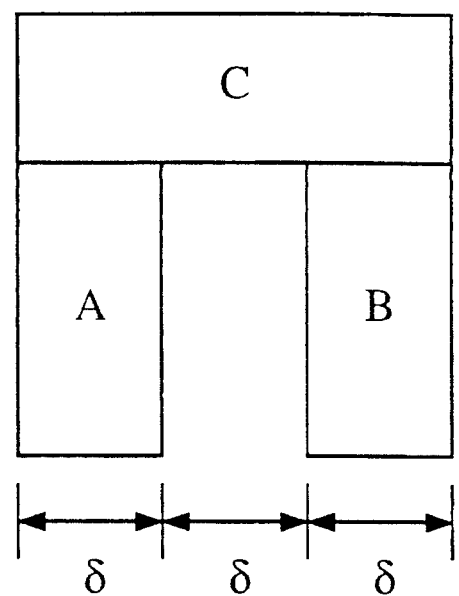
FIGURE 8A  FIGURE 8B
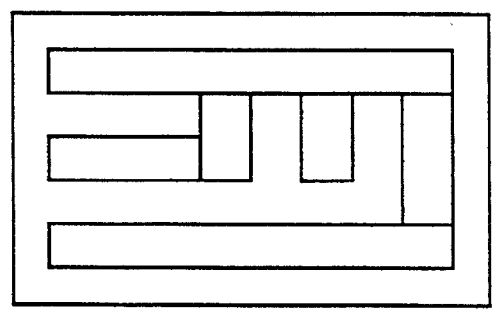
FIGURE 9A
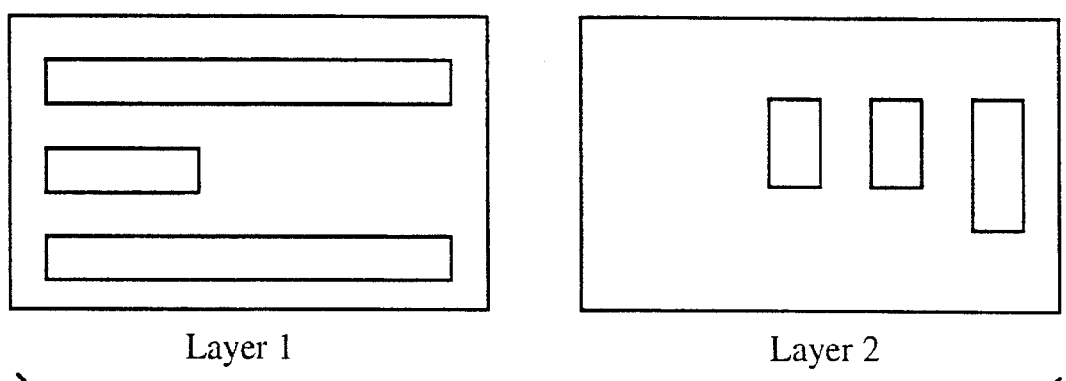
FIGURE 9B

SYSTEMATIC METHOD FOR PRODUCTION OF PHASE-SHIFTING PHOTOLITHOGRAPHIC MASKS

This is a continuation of application Ser. No. 08/051,076 filed Apr. 21, 1993, now abandoned.

The present invention relates generally to techniques for improving photolithographic resolution, and particularly to methods for enhancing such resolution by using phase-shifting masks.

BACKGROUND OF THE INVENTION

Photographic processes have been essential to the microelectronics industry. Accurate, reproducible lines with widths as small as a half micron are routinely produced in monolithic integrated circuits by exposing photosensitive polymers to ultraviolet light through masks which have been photographically fabricated. Submicrometer patterns have been realized using materials that are sensitive to electron beams or x-rays, but such processes are relatively more expensive to implement than systems utilizing light.

Unfortunately, however, when a beam of light is transmitted through an aperture, diffraction causes the light to spread into the dark regions surrounding the beam. An imaging optical system such as that used in photolithography can collect much of the transmitted light and thereby form an image of the aperture, but the finite numerical aperture of any such system causes the image to spread nonetheless. Constructive interference between the light diffracted by adjacent apertures in a transmission mask increases the intensity of light between the apertures, thereby reducing resolution of the optical system. This diffraction phenomenon limits the minimum feature sizes of integrated circuits fabricated using optical lithography.

If it can be arranged that the light waves transmitted through adjacent mask apertures are 180° out of phase, the resultant destructive interference minimizes the intensity between the images engendered by the apertures. This situation may be brought about by covering one of the mask apertures with "phase-shifting elements", i.e., transmissive material of appropriate thickness and index of refraction. Any given photolithographic system will project the images of such a phase-shifting mask with better resolution and higher contrast than it would the images of a corresponding mask lacking phase-shifting elements.

The improvement in resolution afforded may be appreciated by referring to FIGS. 1A and 1B. FIG. 1A shows a conventional transmission mask M having a pair of closely spaced transparent regions T1. In the system of FIG. 1A an optical source (not shown) is provided to illuminate the mask M from above. The bell-shaped distributions indicated by the dotted lines below the mask M represent the wavefront amplitudes which would be developed in plane P1 were the mask M to include only one of the transparent regions T1. The intensity of the resultant image simply corresponds to the squared magnitude of the amplitude. As is indicated by the solid line below the mask in FIG. 1A, when the mask M includes both of the apertures T1 the constructive interference between the wavefronts diffracted by each aperture leads to difficulty in resolving the separate image features.

Referring to FIG. 1B, there is shown a phase-shifting mask PM having a transparent region T2 and a phase-shifting transparent region T3. The phase-shifting mask PM includes a phase-shifting element PS in alignment with transparent region T3, which shifts the phase of the wavefront propagating therethrough by 180 degrees. As is evidenced by the trough in the solid line representation of wavefront intensity below the mask PM, such phase-shifting leads to at least partial cancellation of the optical energy diffracted into the area between the regions T2 and T3. The associated improvement in resolution is indicated by the greater separation between the peaks in the solid line, each of which correspond to a feature in the resultant image.

Despite the improved resolution offered by phase-shifting masks advantages, widespread use thereof has been impeded by the difficulty in determining the correct pattern of phase-shifting elements corresponding to a particular microelectronic circuit.

Existing approaches to the design of phase-shifting masks tend to be based either on intuition or on brute force methodologies such as trial and error. Such heuristic techniques tend to be of assistance only in connection with relatively simple circuit patterns.

Accordingly, it is an object of the present invention to provide a procedure enabling the systematic production of phase-shifting masks for integrated circuits of complex geometry.

SUMMARY OF THE INVENTION

In summary, the present invention is a systematic method of producing a mask for use within a photolithographic illumination system characterized by a transmission function in which light is transmitted through non-opaque portions of the mask positioned in an object plane and in which an image is formed on an image plane. The inventive method includes the steps of defining a binary image pattern to be formed by the illumination system on the image plane; generating a continuous mask function of continuously-varying phase which satisfies predetermined error criteria based on the transmission function and the binary image pattern; transforming the mask function into a quadrature-phase mask function by dividing the continuously-varying phase into four phase levels; and, generating the mask in accordance with the quadrature-phase mask function, wherein the mask includes a plurality of pixel regions each of which has a transmittance corresponding to one of the four phase levels.

BRIEF DESCRIPTION OF THE DRAWINGS

Additional objects and features of the invention will be more readily apparent from the following detailed description and appended claims when taken in conjunction with the drawings, in which:

FIGS. 8a and 8b illustrate the principle of adjacency within Manhattan patterns.

FIG. 9a is an example of a Manhattan geometry pattern requiring at least four discrete phase levels.

FIG. 9b shows one manner in which the pattern of FIG. 9a may be bifurcated such that only two phases are required for each of two metal layers.

DESCRIPTION OF THE PREFERRED EMBODIMENT

Figure 1A:
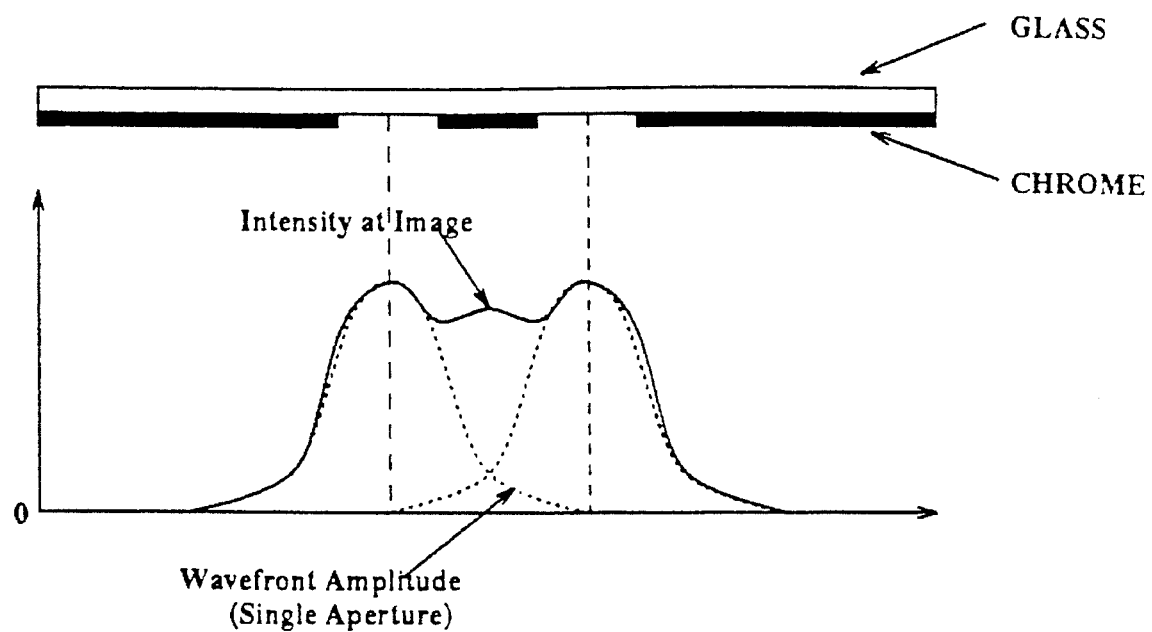
FIGS. 1(a) and 1(b) illustrate optical imaging of a double-pulse pattern using a conventional transmission mask and a phase-shifting mask, respectively.
Figure 1B:
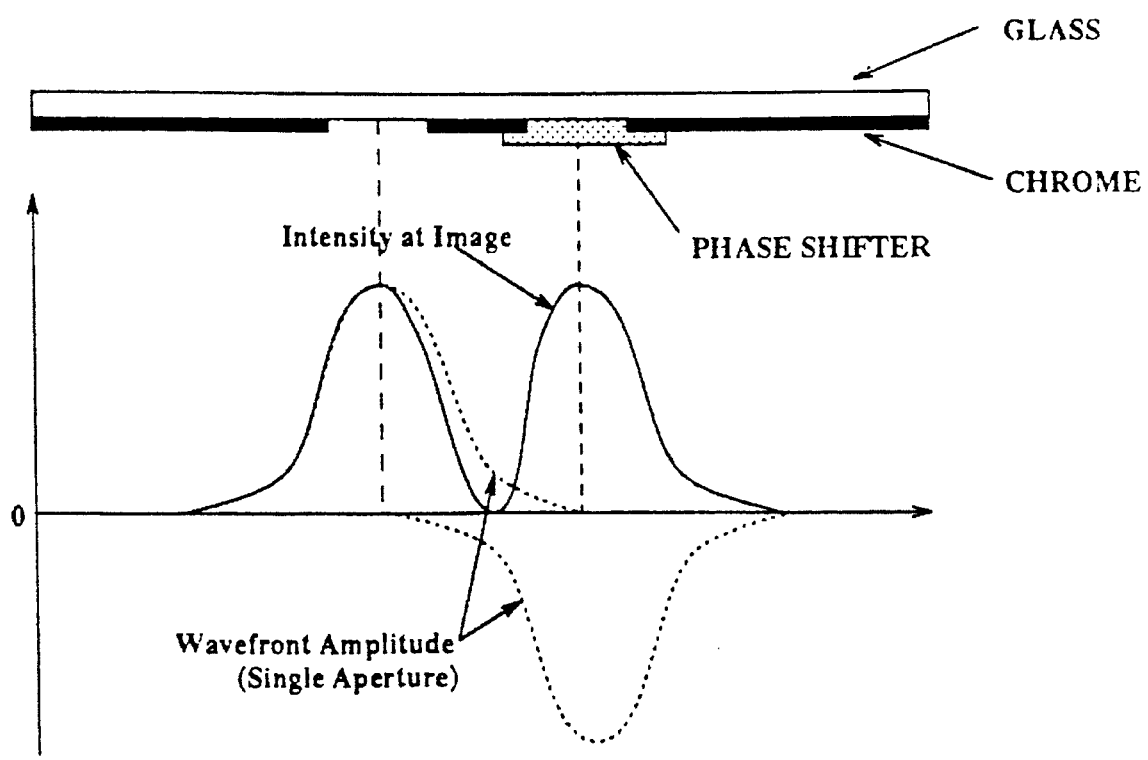
Figure 2:
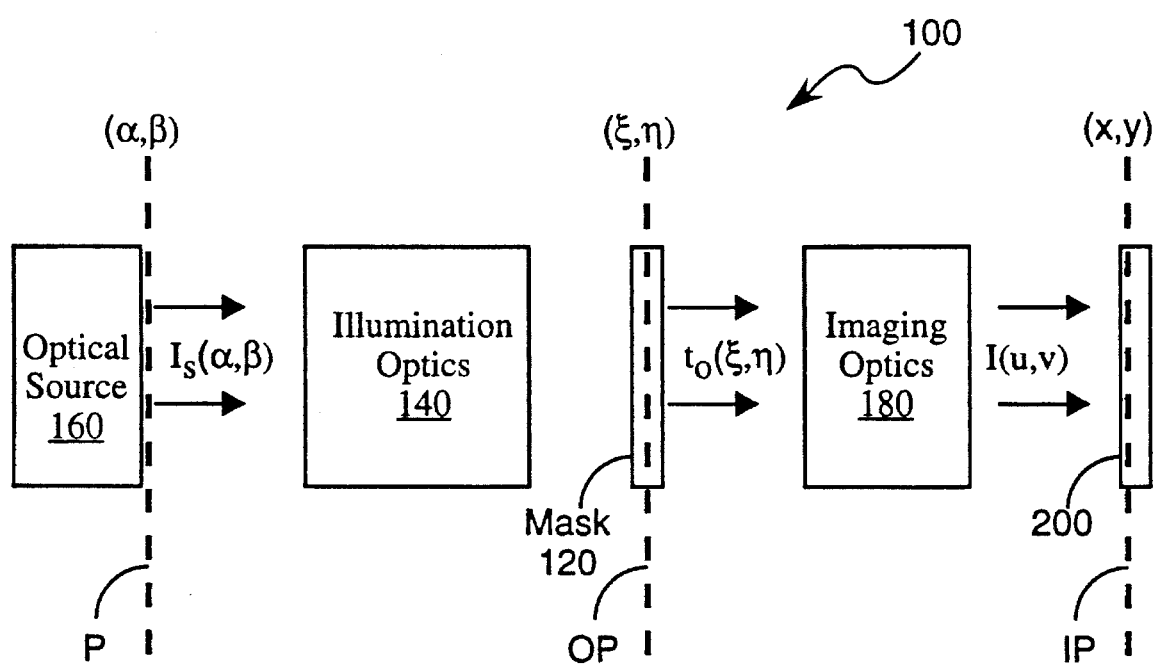
FIG. 2 shows a photolithographic imaging system in which is incorporated a phase-shifting mask produced in accordance with the systematic design method of the present invention.

Referring to FIG. 2, there is shown a photolithographic imaging system 100 in which is incorporated a phase-shifting mask 120 produced in accordance with the systematic design method of the present invention. The mask 120 is positioned in an object plane OP perpendicular to the plane of FIG. 2, with locations on the object plane being identified by coordinates $(\xi,\eta)$. The imaging system 100 further includes illumination optics 140 interposed between the object plane OP and a substantially monochromatic illumination source 160. Illumination optics 140 includes a plurality of lens elements arranged so as to project light from the illumination source 160 in the form of a collimated, partially coherent beam upon the object plane OP. Light from the source 160 is of a wavelength $\lambda$ and is characterized by an intensity distribution function $I_s(\alpha,\beta)$, where coordinates $(\alpha,\beta)$ correspond to locations on an illumination plane P perpendicular to the plane of FIG. 2.

As shown in FIG. 2, the imaging system 100 further includes imaging optics 180 positioned between the object plane OP and an image plane IP. The image plane IP is perpendicular to the plane of FIG. 2, and has associated therewith a (x,y) coordinate system. Imaging optics 180 forms an image of the pattern defined by the mask 120 upon, for example, a semiconductor wafer 200 having an upper surface positioned at the image plane IP. Using conventional semiconductor processing techniques, an integrated circuit having a topology corresponding to the mask pattern may be realized upon the wafer 200.

Figure 3:
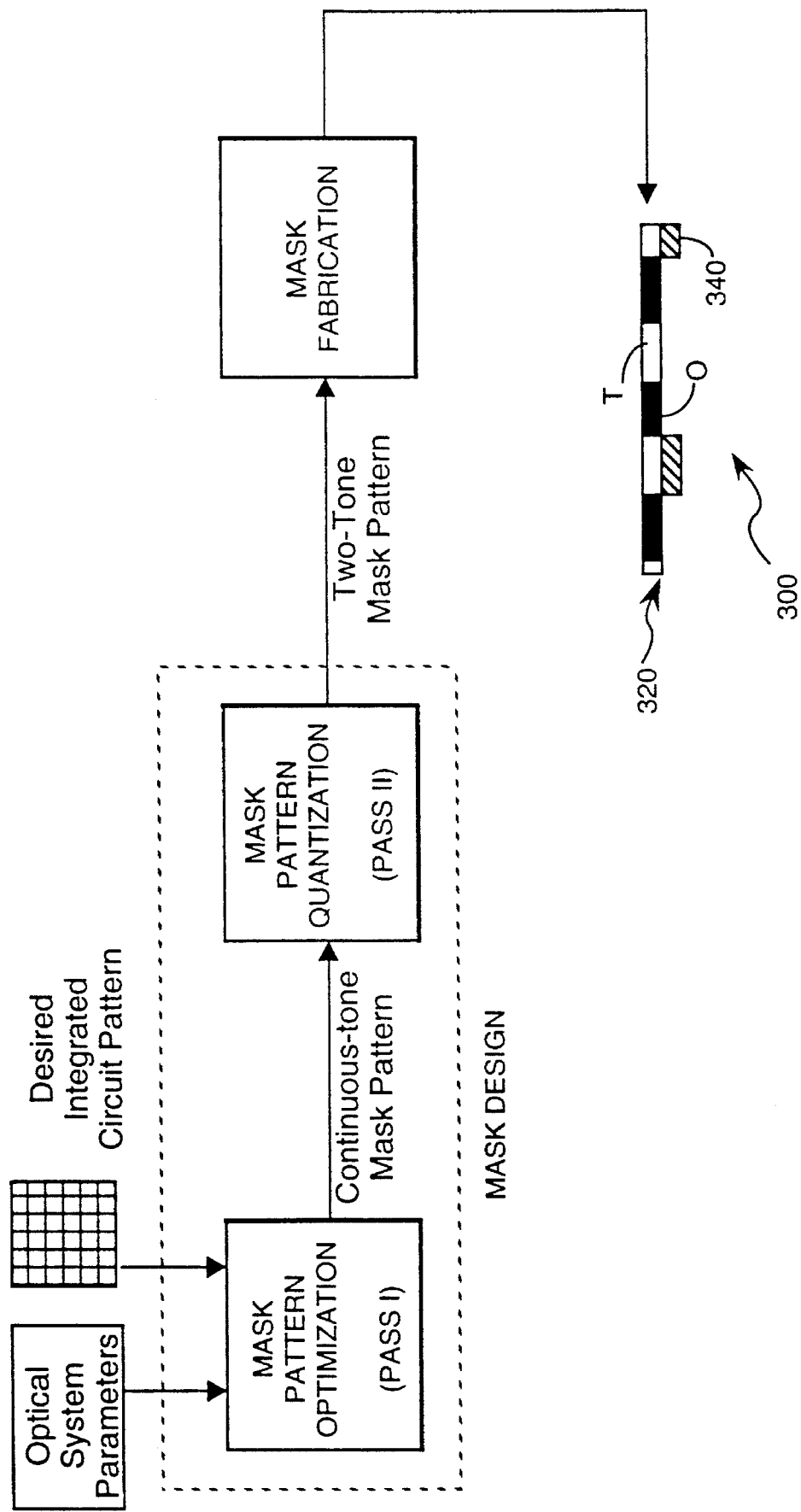
FIG. 3 is a block diagrammatic representation of the systematic mask production technique of the present invention.

FIG. 3 is a block diagrammatic representation of the systematic mask production technique of the present invention. As shown in FIG. 3, the inventive production technique includes a two-pass mask design phase followed by a mask fabrication phase. In Pass I of the design phase, a mask pattern optimization procedure is used to create a phase-shifting, continuous-tone mask pattern on the basis of a desired integrated circuit pattern and a set of optical system parameters. In Pass II, a mask pattern quantization routine transforms the continuous-tone pattern into a two-tone mask pattern divided into a grid of opaque, transmissive, and phase-shifting pixel regions. Standard fabrication techniques may then be used to physically realize a two-tone phase-shifting mask 300 on the basis of the two-tone mask pattern. As shown in FIG. 3, a two-tone mask 300 produced using the inventive process includes a substrate layer 320 composed of, for example, glass or quartz. The mask 300 is divided into a grid of optically opaque O and transparent T areas, with a plurality of phase-shifting elements 340 being attached to selected transparent areas T. Transparent areas T of substrate layer 320 covered by a phase-shifting element 340 correspond to phase-shifting pixel regions, while transparent areas T lacking an appurtenant phase-shifting element 340 correspond to transmissive pixel regions. Opaque pixel regions are associated with opaque areas of substrate layer 320.

Although specialized techniques may exist for fabricating masks with substrate layers having quasi-continuous transmissivity profiles, large-scale production of masks having substrates with exclusively opaque and non-opaque areas (i.e., binary masks) is currently feasible. Accordingly, in practical applications it is anticipated that mask fabrication will typically occur subsequent to completion of Pass II of the design procedure. Nonetheless, continuous-tone phase-shifting masks will tend to provide higher resolution than the binary masks derived therefrom.

As is well known, lithography in integrated circuit manufacturing is the collection of processes which transfer two-dimensional patterns to corresponding three-dimensional material structures. In optical lithography, the process via which such a transfer is enacted involves the selective exposure of a photosensitive (resist) material by means of optical imaging of the pattern. The two-dimensional pattern, in conventional optical lithography, is prescribed by a 'binary' mask composed of opaque and transparent regions. Such masks are often referred to as transmission masks.

Transmission masks may be described by a function $F(.,.) \in L^2(IR^2)$, where the mask is to be used in an imaging system characterized by a nonlinear operator T. The operator T provides a mapping from the mask F to the dual plane intensity G. The output G of the imaging system T with F as its input may then be represented by the relation, $$G = T(F). \tag{1}$$

The mask function F is a binary function taking values from {0, 1}. For a given imaging system T, the following notations will be employed:

$\overline{G} \triangleq \{G | G = T(F), F \in L^2(IR^2)\}$—The set of all achievable images with imaging system T.

$\overline{F}_b \triangleq \{F \in L^2(IR^2) | F(x,y) \in \{0,1\}\}$—The set of all binary transmission masks.

$\overline{G}_b \triangleq \{G | G = T(F), F \in \overline{F}_b\}$—The set of all achievable images using transmission masks.

In general, the set $\overline{G}_b$ will be a proper subset of $\overline{G}$, i.e., not all images in the set of achievable images may be obtained using binary transmission masks. Since in principle the mask function F may be an arbitrary (complex-valued) function, the number of degrees of freedom in a transmission mask is limited. Accordingly, additional design flexibility would be achieved by enlarging the set of allowable mask functions.

It has been suggested that increased resolution may be achieved by using masks which are binary-valued in transmittance as well as phase, with the phase taking values from $\{0,\pi\}$. Such masks are referred to as phase-shifting masks. Formally, the class $\overline{F}_L$ of phase-shifting masks is represented as:

$$\overline{F}_L \triangleq \{F \in L^2(IR^2) | F(x,y) \in \{0,1,-1\}\} \tag{2}$$

To precisely formulate the problem of phase-shifting mask design and to develop systematic procedures for solving the problem, it is necessary to provide a model relating intensity at the image plane to the mask function.

The process of optical imaging may be described by the following nonlinear integral equation:

$$G(x,y) = (T(F))(x,y) = \int_{R^4} F(\xi_1,\xi_2)J_o(\xi_1,\xi_2,\eta_1,\eta_2)F^*(\eta_1,\eta_2)K(x,y,\xi_1,\xi_2)K^*(x,y,\eta_1,\eta_2)d\xi_1,d\xi_2,d\eta_1,d\eta_2, \qquad (3)$$

where, $G(.)$=Intensity at the image plane.

$K(.)$=Coherent point spread function—describing properties of the imaging system.

$J_0(.)$=Mutual intensity function—describing coherence properties of the illumination.

$F(.)$=Object being imaged (mask).

It is assumed the imaging system is translation invariant ($K(x,y,u,v)=K(x-y,y-v)$). It is further assumed that the mutual intensity function $J_0$ satisfies $J_0(x,y,u,v)=J_0(x-y,y-v)$ and is Hermitian ($J_0(-u,-v)=J_0^*(u,v)$).

Two important special cases of Equation (3) correspond to situations where the illumination is completely coherent (($J_0(x,y)\equiv 1$), and where the illumination is completely incoherent ($J_0(x,y)=\delta(x,y)$). For completely coherent illumination Equation (3) simplifies to $$G=|F*K|hu\ 2, \qquad (4)$$

where * denotes the two-dimensional convolution operator, $(G*H)(x,y)=\iint G(\xi_1,\xi_2)H(x-\xi_1,y-\xi_2)d\xi_1 d\xi_2$.

For incoherent illumination (3) reduces to $$G=|F|^2*|K|^2. \qquad (5)$$

In what follows, a process will be described for finding a mask function F, given a desired image $G^d(x,y)$, such that:

$G^d(x,y)=(T(F))(x,y)$.

The process involves attempting to find a set of solutions to the nonlinear integral equation (3). In the event that no exact solutions exist, the process will entail selecting an optimality of an approximate solution. In this regard, knowledge of the lithographic process may be utilized in the design of a suitable error measure.

In what follows there is considered the approximation of a partially coherent imaging system by one or more coherent imaging systems. As will be shown, the simplicity of the selected coherent imaging model leads to substantial computational and analytical benefits. The approximations considered herein are based on representations of partially coherent imaging systems as weighted superpositions of coherent imaging systems. For purposes of illustration, there will initially be considered a one-dimensional imaging equation:

$$G(x) = \int_{\mathbb{R}}\int_{\mathbb{R}} F(\eta_1)J_o(\eta_1-\eta_2)F^*(\eta_2)K(x-\eta_1)K^*(x-\eta_2)d\eta_1 d\eta_2. \qquad (6)$$

One potential approach to be followed in the coherent decomposition of a partially coherent system is to use symmetric separable representations of the mutual intensity function $J_0$. A symmetric separable representation of $J_0$ corresponds to either an integral or series representation of $J_0$, in which each term (the kernel for integral representations) is symmetrically separable in its arguments. As an example, the function $\phi(x,y)$ is symmetrically separable if there exists a $\psi$, such that $\rho(x,y)=\psi(x)\psi^*(y)$. An example of a separable representation of $J_0(\eta)$ is provided by the following Fourier integral representation:

$J_0(\eta)=\int \hat{J}_0(\omega)e^{i\omega\eta}d\omega$.

Substituting this Fourier integral representation of the mutual intensity function into Equation (6) gives, $$\begin{aligned}G(x) &= \int \hat{J}_o(\omega)\iint F(\eta_1)F^*(\eta_2)e^{i\omega(\eta_1-\eta_2)}K(x-\eta_1)K^*(x-\eta_2)d\eta_1 d\eta_2 d\omega \\ &= \int \hat{J}_o(\omega)|F*K_\omega|^2 d\omega\end{aligned} \qquad (7)$$

where $K_\omega(\eta)=e^{i\omega\eta}K(\eta)$.

Equation (7) was viewed as a representation of a partially coherent imaging system by a weighted superposition of coherent imaging systems.

Since the size of the object being imaged may exceed that capable of being represented using the continuous function $J_0$, a discretization of the Fourier representation of $J_0$ in Equation (7) may be employed. This discretization, with periodic extension beyond the object boundaries, may be expressed as:

$$G(x) = \sum_m \alpha_m |F*K_m|^2, \qquad (8)$$

where, $K_m(\chi)=e^{im\omega 0\chi}K(\chi)$, and $\alpha_m$ are the Fourier coefficients of $J_0$.

IV. OPTIMAL COHERENT APPROXIMATIONS

In this section, a procedure will be described for approximating a partially coherent imaging system by a single coherent system. As a first step the imaging model of Equation (6) is rewritten as:

$$G(\chi)=(T(F))(\chi)=\iint F(\eta_1)F^*(\eta_2)W(\chi-\eta_1,\chi-\eta_2)d\eta_1 d\eta_2, \qquad (9)$$

where $$W(\eta_1,\eta_2)=J_0(\eta_2-\eta_1)K(\eta_1)K^*(\eta_2) \qquad (10)$$

The function W may be decomposed into the sum of a separable term and a residual, i.e., $$W(\eta_1,\eta_2)=Q(\eta_1)Q^*(\eta_2)+R(\eta_1,\eta_2) \qquad (11)$$

Substituting Equation (11) into the imaging model (9), one obtains:

$$\begin{aligned}G(x) &= \iint F(\eta_1)F^*(\eta_2)(Q^*(x-\eta_2)Q(x-\eta_1)+R(x-\eta_1,x-\eta_2))d\eta_1 d\eta_2 \\ &= |(F*Q)(x)|^2 + \mathcal{R}_{(F)}(x)\end{aligned} \qquad (12)$$

Equation (12) represents the output of a partially coherent imaging system as the output of a coherent system plus a residual term $\bar{R}$. The function Q will be referred to as the point-spread function of an optimal first-order coherent approximation if the function Q in Equation (11) is chosen so as to minimize the $L^2$ norm of R. Note that since $W(\eta_1,\eta_2)$ is not a function of $\eta_1-\eta_2$, approximations of the form set forth in Equation (11) are expected to be preferable to those obtained by decomposing $J_0$.

In order to examine some of the properties of optimal coherent approximations there is defined the following linear integral operator $A^{(\chi)}:L^2 \to L^2$, $$(A^{(\chi)}f)(\eta_1) = \iint W(\chi-\eta_1,\chi-\eta_2)f(\eta_2)d\eta_2. \quad (13)$$

Note that $A^{(\chi)}$ is not a convolution operator in the usual sense. The imaging operator T, may be expressed in terms of $A^{(\chi)}$ as $$G(\chi) = (T(F))(\chi) = \langle A^{(\chi)}F, F \rangle, \quad (14)$$

where $\langle \cdot, \cdot \rangle$ denotes the standard innerproduct[3] on $L^2$. With the assumptions that $W(\eta_1,\eta_2) = W(\eta_2,\eta_1)$ and that W is continuous, it may be shown that W has the following (Mercer) expansion.

$$W(\eta_1, \eta_2) = \sum_{k=1}^{\infty} \lambda_k \phi_k(\eta_1)\phi_k(\eta_2), \quad (15)$$

where $\{\lambda_k\}$, and $\{\phi_k\}$, are the nonzero eigenvalues and corresponding eigenvectors of the operator $A \triangleq A_0$. Assuming the eigenvalues and eigenvectors have been ordered such that $\lambda_1 \geq \lambda_2 > \ldots$, it may be shown that optimal approximations of W, are given simply by truncations of the Mercer expansion in Equation (15). As a consequence, given W, $\{\lambda_k\}$, and $\{\phi_k\}$ as above, an optimal $n^{th}$-order coherent approximation to the partially coherent imaging system T, defined by W is given by:

$$(T_n F)(x) = \sum_{k=1}^{n} \langle A_k^{(x)} F, F \rangle = \sum_{k=1}^{n} \lambda_k |(F * \phi_k)(x)|^2,$$

for $n = 1, 2, \ldots$ where $A_k^{(\chi)}$ is the integral operator with kernel $$W_k(\chi-\eta_1,\chi-\eta_2) = \lambda_k \phi_k(\chi-\eta_1)\phi(\chi-\eta_2).$$

In addition, if it is assumed that $$\|W - \bar{W}\|_d \leq \epsilon,$$

where $\bar{W}$ is an approximation of W and $\bar{T}$ denotes the imaging operator defined by $\bar{W}$, then $$\sup_x |G(x) - \tilde{G}(x)| \leq \epsilon \|F\|^2,$$

where G=TF, and $\tilde{G}=\tilde{T}F$.

Note that the expression for $(T_n F)(x)$ given above bounds the pointwise error induced in the image by an approximation to W, i.e. the error inddeced in the image is uniformly bounded. Note also that the $\|F\|_2$ factor in the error bound does not play any role since we are always free to multiply by a scalar to normalize F to have unit norm.

The above assumes we know the norm of the error in approximating W. If we use an optimal coherent approximation, it is clear that the error in approximating W should depend on the coherence factor $\sigma$, of the partially coherent system. Due to the difficulty in determining the eigenvalues and eigenfunctions of A analytically, we demonstrate in FIG. 4, the numerically determined accuracy with which W may be approximated by a single term from the Mercer expansion, for different values of the coherence factor $\sigma$. The zero-order approximation, shown for comparison, corresponds to simply setting $J_0 \equiv 1$.

Figure 4:
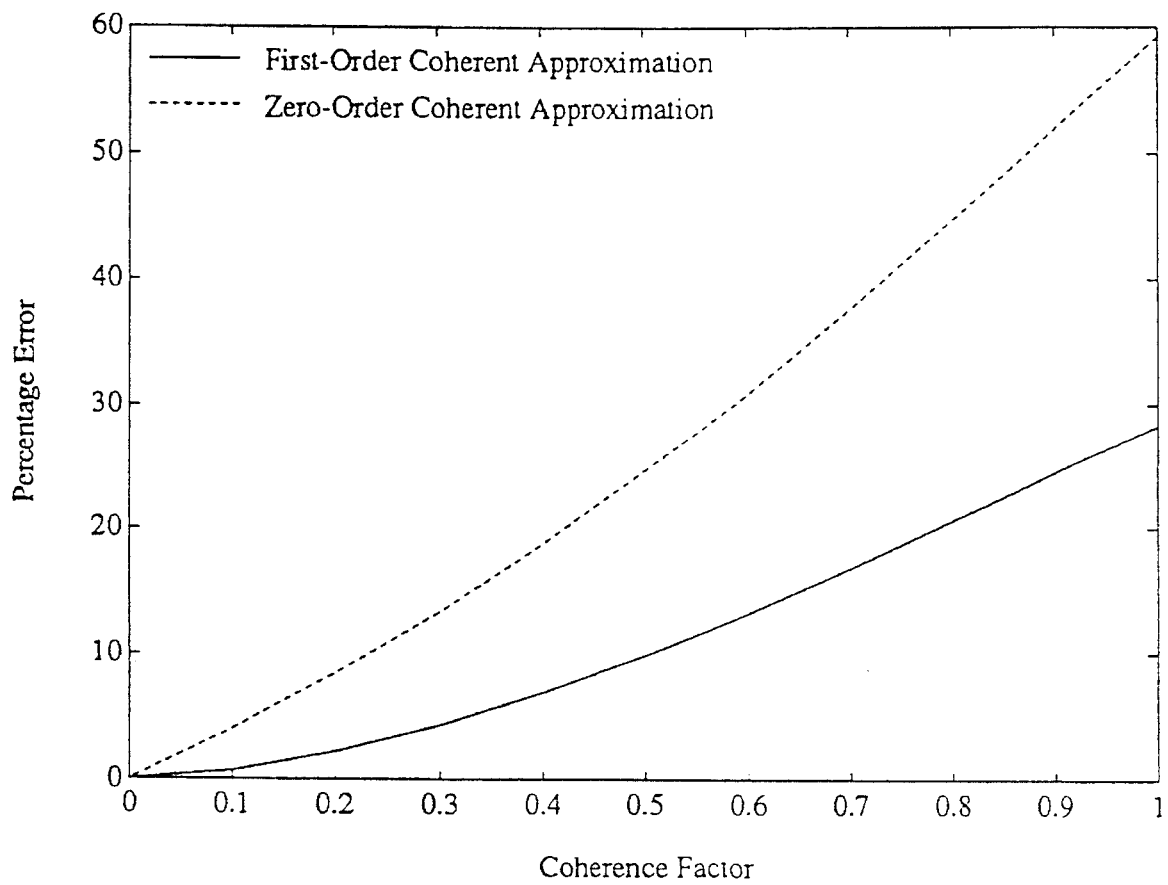
FIG. 4 depicts percentage error versus coherence factor for both a first-order coherent approximation and a zero-order coherent approximation to a partially coherent imaging system.

Specifically, FIG. 4 shows percentage error versus coherence factor $\sigma$, for both a first-order coherent approximation and a zero-order coherent approximation to a partially coherent imaging system.

Two essential features of phase-shifting mask design algorithms must be computational efficiency and modest storage requirements. The reason for these requirements are clear when one considers the enormous sizes of data sets that represent real IC patterns. In this section we present an iterative algorithm for phase-shifting mask design.

Our approach to the phase mask design problem shall be the following: (1) Treat the case of a first-order coherent approximation, (2) Use the methods of Section 2.3.1 to refine solutions through higher-order coherent approximations when needed.

For the case of a first-order coherent approximation to a partially coherent imaging system, we take an approach where we (1) identify properties of the solutions which may be described in terms of set membership, and then (2) use an alternating projection approach to find the solutions.

In many cases of practical interest, the Fourier transform $\hat{K}$ of the coherent point spread function is compactly supported. Let $S_\Omega$ denote a disk of radius $\Omega$, centered at the origin. For a first-order coherent approximation Q, $(W_1(\eta_1, \eta_2) = Q(\eta_1)Q^*(\eta_2) = \lambda_1\phi_1(\eta_1)\phi_1(\eta_2))$ we make the assumption that the Fourier transform $\hat{Q}$, of Q, is compactly supported on $S_\Omega$. We shall further assume that the linear filter defined by the kernel Q, is invertible. We shall justify these assumptions later.

Let us define, $$\mathcal{S}_1 = \{H \in L^2(\mathbb{R}^2) | supp(\hat{H}) \subseteq S_\Omega\}.$$

where supp(g) denotes the support of g. Hence the set of all achievable images $\mathcal{G}$ in this case is exactly the set of functions which are the square-magnitudes of functions in $\mathcal{S}$. The corresponding mask functions are obtained by applying the inverse of the filter Q on $\mathcal{S}$.

As noted above, our goal is to achieve a prescribed image intensity. The ideal desired intensity is often specified as a binary-valued function. Since such discontinuous binary images are in general unachievable, we need to specify a measure of optimality with respect to the ideal intensity. We consider two such measures of optimality, the first being the standard $L^2$ error, and the second a somewhat relaxed error measure which takes into account the nonlinearities in the etching process. These two optimality measures effectively define sets of acceptable images.

$L^2$ Error: One possibility for measuring the error between an arbitrary intensity G and the desired ideal intensity $G^d$, is the $L^2$ norm of the difference, $$\|G - G^d\|^2 = \int |G - G^d|^2. \quad (16)$$

However, such an error measure is not well-suited to lithography applications. An improved form of $L^2$ error may however be used here, since we have additional knowledge about the imaging system. We know here that the (mask) function whose squared magnitude is the intensity, has Fourier transform supported on $S_\Omega$. Thus the Fourier transform of the intensity, must have support restricted to $S_{2\Omega}$. To incorporate this knowledge in the error measure, the binary ideal desired intensity may be projected onto the set of nonnegative functions with Fourier transform support restricted to $S_{2\Omega}$. This results in a new band-limited target intensity $\tilde{G}^d$ which may be used in place of $G^d$ in (16). This leads to the definition of the set $\mathcal{S}\frac{1}{2}$, of complex-valued functions on the plane with the 'correct' desired magnitude;

$$\mathcal{S}\frac{1}{2} = \{H \in L^2(\mathbb{R}^2) \mid |H|^2 = \tilde{G}^2\}.$$

Figure 5:
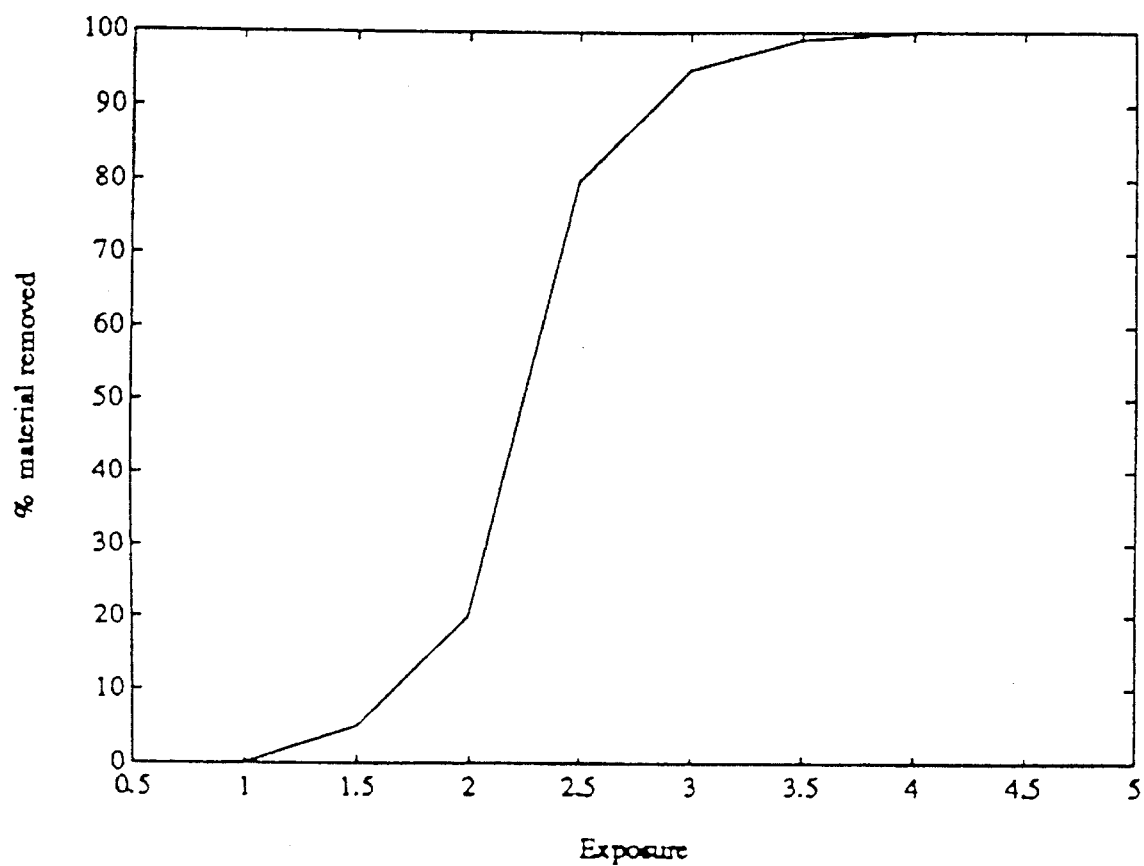
FIG. 5 is an empirically obtained curve showing the percentage of material removed versus resist exposure levels for a fixed development time.

Process-Based Error: Since the ultimate goal is to generate acceptable etched patterns it seems reasonable to consider error measures which utilize knowledge of the etching process. A key property of the etching process, which may be used in the construction of such an error measure, is the saturating nonlinear behavior of the etching rate. FIG. 5 is an empirically obtained curve showing the percentage of material removed versus resist exposure levels for a fixed development time. The saturating behavior of this curve allows of to define equivalence classes of intensities. For example it is clear that exposure levels above a certain threshold are roughly equivalent since all such exposure levels result in identical amounts of material being removed via etching. Let $\chi^+$ denote this threshold. Similarly one may define a lower threshold $\chi^-$, below which the exposure is equivalent to zero. To use this information we first use the desired image to specify a partition of the image plane. Let $D^+$ = The set where the intensity should be greater than $\chi^+$ $D^-$ = The set where the intensity should be greater than $\chi^+$ $\overline{D}$ = The set where the intensity may take arbitrary values.

Figure 6:
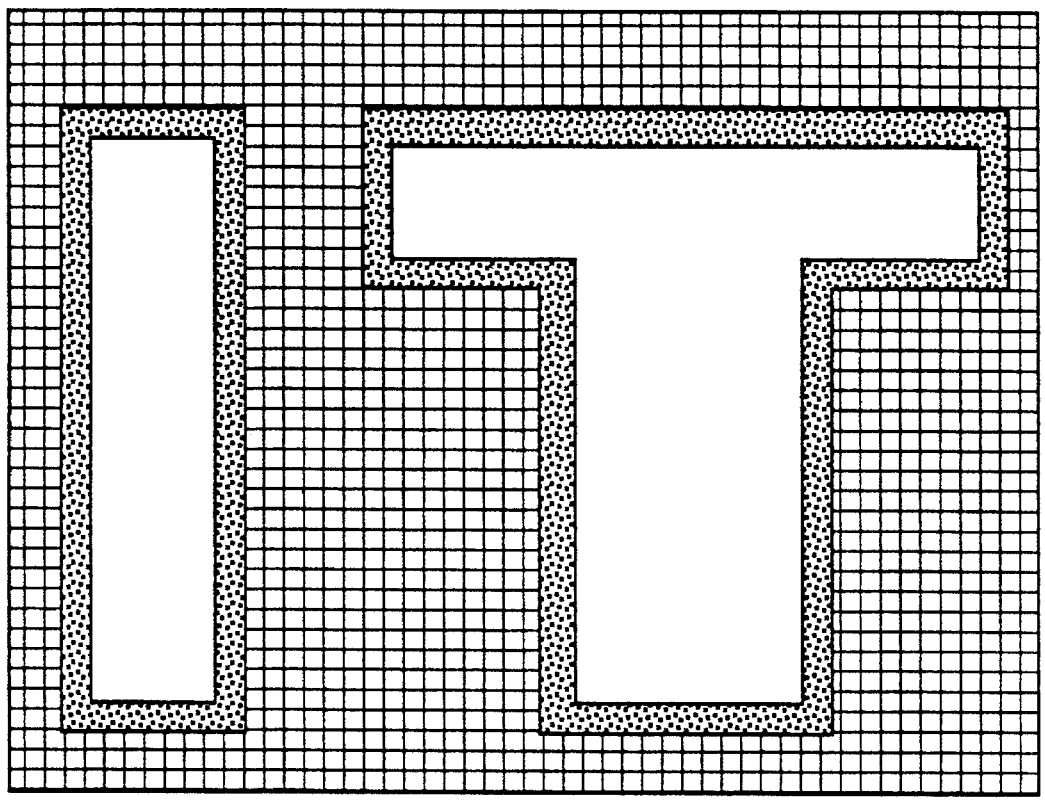
FIG. 6 shows a three-level partitioned representation of a desired image.

Such a partition of the image plane is shown in FIG. 6 where the light region is $D^+$, the dark region is $D^-$, and the grey region is $\overline{D}$. Note also the analogy with filter design in which $D^+$ specifies the pass band, $D^-$ specifies the stop band, and $\overline{D}$ the transition band. We may now use the above partition to define an equivalence class of images with respect to a given ideal image $G^2$.

Given a binary ({0,1}-valued) desired image intensity $G^d$, and a partition $\{D^+, D^-, \overline{D}\}$ defined with respect to $G^d$ as above, $$\mathcal{W}(G^d) = \left\{ G \in L^2(\mathbb{R}^2) \mid G \geq 0, \begin{pmatrix} G(x,y) \leq \chi^- & \text{for } (x,y) \in D^- \\ G(x,y) \geq \chi^+ & \text{for } (x,y) \in D^+ \end{pmatrix} \right\}$$

Note that since the definition above is restricted to nonnegative functions, $\mathcal{W}(G^d)$ is a convex set. However, the set of functions whose magnitudes are contained in $\mathcal{W}(G^d)$, is not convex. For a nonnegative function $G \in L^2(\mathbb{R}^2)$, it is easily shown that the projection $P_\mathcal{W}$ onto $\mathcal{W}(G^d)$ is defined by, $$(P_w(G))(x,y) = \begin{cases} \chi^+ & \text{if } (x,y) \in D^+ \text{ and } G(x,y) < \chi^+ \\ \chi^- & \text{if } (x,y) \in D^- \text{ and } G(x,y) > \chi^- \\ G(x,y) & \text{else} \end{cases}$$

For a given desired binary image $G^d$, let $$\mathcal{S}\frac{2}{3} = \{H \in L^2(\mathbb{R}^2) \mid |H|^2 \in \mathcal{W}(G^d)\}.$$

As observed above, $\mathcal{S}\frac{2}{3}$ is not a convex set.

The set definitions given above allow us to precisely define what we mean by a solution to phase-shifting mask design problem, in the event that exact solutions do not exist. The two separate definitions of sets of acceptable images, lead to the definition of two classes of solutions.

Given a closed set C in a Hilbert space $\mathcal{H}$, a projection $P_C$, onto C is defined by the following properties.

(1) $P_C f \in C$ for any $f \in \mathcal{H}$.

(2) $P_C$ is idempotent i.e $P_C^2 = P_C$.

(3) For any $f \in \mathcal{H}$, $\|f - P_C f\| \leq \|f - g\|$ for any $g \in C$.

In addition, given a binary desired image $G^d$, and an imaging system described by T, (1) $\tilde{F} \in L^2(\mathbb{R}^2)$ is a solution of Class 1 to the phase-mask problem if, $$\|T(\tilde{F}) - P_{2_1} T(\tilde{F})\| \leq \|T(F) - P_{2_1} T(F)\| \text{ For any } F \in L^2(\mathbb{R}^2)$$

(2) $\tilde{F} \in L^2(\mathbb{R}^2)$ is a solution of Class 2 to the phase-mask problem if, $$\|T(\tilde{F}) - P_{2_2} T(\tilde{F})\| \leq \|T(F) - P_{2_2} T(F)\| \text{ For any } F \in L^2(\mathbb{R}^2)$$

where $P_{2_1}$ and $P_{2_2}$ are projection operators onto the $S_2^{(1)}$ and $S_2^{(2)}$ respectively[4], and the sets of acceptable images, $S_2^{(1)}$ and $\mathcal{2}_2^{(2)}$, are defined with respect to $G^d$.

[4] Note that these projections need not be uniquely determined

Both classes of solutions are defined so that the distance between the set of achievable images and the set of acceptable images is minimized. The difference lies simply in the definition of an acceptable image.

In what follows solutions are defined as minimizing arguments of particular error measures. In some cases, it may be that the error for the minimizing solution is zero. We shall refer to such solutions as exact solutions (of Class 1 or Class 2).

By the definitions of the last section, an exact solution is any mask function F, which is mapped by the imaging system T, to an image G which lies in the intersection of the set of achievable images and the set of acceptable images, i.e. $T(F) \in \mathcal{S}_1 \cap \mathcal{S}_2^{(k)}$, k=1,2.

In accordance with the invention, an alternating projection method is used to obtain the mask function. The basic premise of this method is that since projections onto closed convex set are nonexpansive mappings, a repeated sequence of projections onto each one of the sets may be shown to converge to an element of the intersection of all the sets. More precisely, if we have n closed convex sets, $C_1, \ldots, C_n$, sets and define projections $P_1, \ldots, P_n$, onto these sets, then for any initial vector $f_0$, $$(P_1 \cdot P_2 \ldots P_n)^N f_0 \to f \in \bigcap_{j=1}^{n} C_j, \text{ as } N \to \infty.$$

In application of alternating projection methods, known properties of a desired solution are used to define the sets $C_j$. In this manner a variety of a priori knowledge may be incorporated as (possibly nonlinear) constraints on the solution. A sequence of projections is then applied to find solutions which lie in the intersection of all the sets and thereby satisfy all the constraints.

As noted above, finding an exact solution to the phase-mask design problem may be viewed as equivalent to finding an element in the intersection of $\mathcal{S}_1$ and $\mathcal{S}_2^{k}$. In cases where exact solutions do not exist, an optimal solution in the sense of Definition 3.3 is one which minimizes the distance between $\mathcal{S}_1$ and $\mathcal{S}_2^{k}$.

If $\mathcal{S}_2^{(1)}$ is used as the set of acceptable images, then the problem as stated here is exactly the problem of phase-retrieval.

Simply stated, the phase-retrieval problem is one of recovering the phase of a function, given only its magnitude and some additional constraints such as knowledge of the support of its Fourier transform.

In the problem of phase-shifting mask design, we may relax the problem by using $\mathcal{S}_2^{(2)}$ as our set of acceptable images.

Let us first define the appropriate projections. Let $\hat{f} \in L^2(\mathbb{R}^2)$, $f = |f| \exp(i\phi_f)$, and let $\hat{f}$ denote the Fourier transform of $f$.

Figure 7:
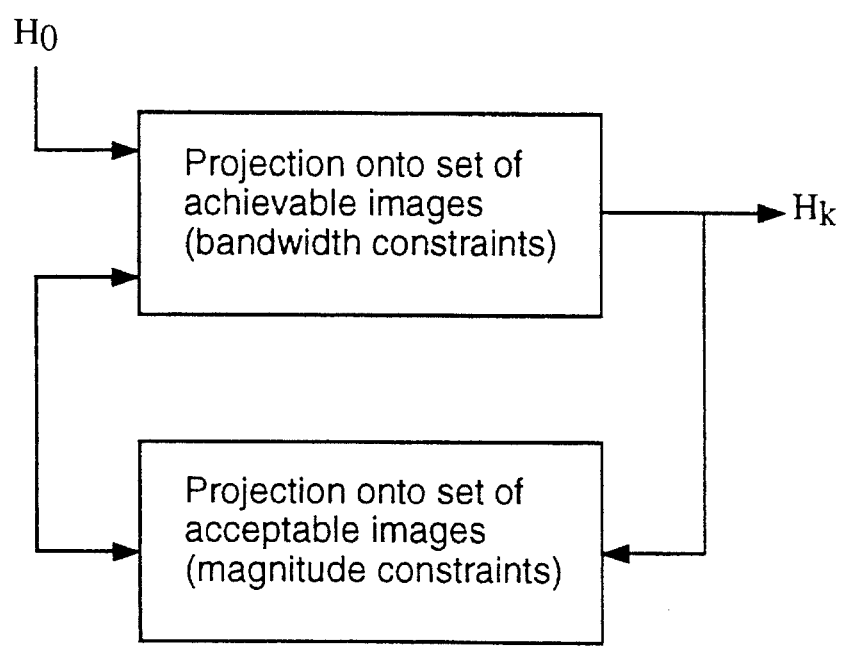
FIG. 7 depicts an alternating projection loop for phase-shifting mask design.

Projection onto $\mathcal{S}_1$: $\hat{P_1 f}(\omega_1, \omega_2) = \begin{cases} \hat{f}(\omega_1, \omega_2) & \text{if } (\omega_1, \omega_2) \in \Omega \\ 0 & \text{if } (\omega_1, \omega_2) \notin \Omega \end{cases}$ Projection onto $\mathcal{S}_2^{(1)}$: $P_2 f = (\tilde{G}^d)^{1/2} \exp(i\phi_f)$
Projection onto $\mathcal{S}_2^{(2)}$: $P_2 f = (P_w|f|)^{1/2} \exp(i\phi_f)$, where $\tilde{G}^d$, $W$, and $PW$ are as defined above. To apply a alternating sequence of projections, we simply start with an initial guess $H_0$ and then use the projections defined above to iteratively project onto the sets of achievable and acceptable images (see FIG. 7). Let $H_\infty$ be the solution to which the above algorithm provides after some convergence criterion has been satisfied. Then the corresponding mask function is obtained by applying the inverse of the filter Q, to $H_\infty$. The corresponding image is simply $|H_\infty|^2$.

Note that the most expensive computation in the projection loop is the Fourier transform. Hence the computational complexity of this algorithm is of the order O (NlogN), where N is the number of pixels used in the discretization of the image.

In the algorithm described in the last section we are in general generating solutions (complex-valued mask functions) with continuously varying magnitude and phase. Since the ultimate goal is to actually manufacture phase-shifting masks specified by the design procedure, we need to examine the problem of quantizing phase and magnitude to a finite number of levels.

An interesting alternative to direct quantization of the phase of a mask function is to use two exposures each with a two-phase mask. The two masks may be chosen such that the resulting image is exactly the same as the image of a mask with continuously varying phase.

Let $G \in L^2(\mathbb{R}^2)$ be any (intensity) image in the range of a given partially-coherent imaging operator T, i.e.

T(F)=G, for some complex-valued mask function $F \in L^2(\mathbb{R}^2)$.

Then there always exists a pair of real-valued masks $F_1$ and $F_2$, such that successive imaging of $F_1$ and $F_2$, results in the the same image G, i.e.

G=T($F_1$)+T($F_2$).

In particular we may identify $F_1$ with $\Re F$, and $F_2$ with $\Im F$.

Remarks

The significance of the above lies in the fact that real-valued mask functions have only two phases, 0 or $\pi$. Hence, any image that is attainable using a mask with continuously varying phase, is also attainable via two exposures, each using a mask with only two phases, 0 and $\pi$.

4.2 Phase Quantization and the Number of Phase Levels

With the restriction that the image must be generated using a single mask, it becomes necessary to consider discrete phase values.

For the case of patterns defined by Manhattan geometries, it has been determined that four discrete phase values will generally be required.

For a given Manhattan geometry, let $\delta$ be the minimum feature size of a given binary pattern. The pattern shall be said to have a Manhattan Geometry if, there exists a partition of the pattern which gives a collection of objects (corresponding to elements of the pattern with value 1) such that:

(1) All objects are rectangles and any two rectangles which share an entire edge are merged and considered as a single rectangular object.

(2) All edges of objects have either vertical or horizontal orientation.

(3) All edges have length $\geq \delta$.

Given an arbitrary pattern with Manhattan geometry and minimum feature size $\delta$, assume:

(1) Any two objects whose edges (or edge-segments of nonzero length) are separated by a spacing of $\delta$ from one another must be assigned different phases.

(2) An object C which is connected to two objects A and B, satisfying (1), must be assigned a phase distinct from the phases of A and B.

Then a phase-shifting mask used to image the pattern must use a minimum of four distinct phase levels.

Remarks

To justify the first hypothesis of the above we refer to FIG. 8(a). Since the basic principle of a phase-shifting mask is to induce destructive interference in the region between the two objects A and B, and thereby permit resolution of both objects, it is clear that A and B should be assigned distinct phases. In the setting of FIG. 8(b), A and B must be assigned distinct phases so as to permit resolution of the two objects. Since C is connected to both A and B and we want to ensure that there are no 'gaps' in the image, C must be assigned an 'intermediate' phase value which is distinct from the phases of A and B.

While the two hypotheses would seem to imply that three phases should apply, in fact a minimum of four mask phases are required to be able to form arbitrary image patterns. This result is analogous to the well known "four color map theorem" that holds that the regions of any two dimensional image can each be assigned one of four colors so that no two adjacent regions are assigned the same color.

In this section two alternatives were proposed for the use of phase-shifting masks for general patterns: (1) use a single mask with a minimum of four phase levels, and (2) use two exposures with a pair of masks with two phase levels each. A third possibility is to devise a modified set of design rules for patterns requiring phase-shifting masks. There are a number of possibilities for such modified design rules. We shall not elaborate on all the possibilities, but we illustrate this idea by means of example. FIG. 9(a) is an example of a Manhattan geometry pattern which requires at leat four discrete phase levels. If this were to represent a metal pattern, the fact that at least two levels of metal are available, may be exploited by specifying design rules which require the pattern be divided between the two layers as in FIG. 9(b). Each of the two layers in FIG. 9(b) require only two phases.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A systematic method of producing a mask for use within a photolithographic illumination system characterized by a transmission function in which light is transmitted through non-opaque portions of said mask positioned in an object plane and in which an image is formed on an image plane, comprising the steps of:

formulating a coherent approximation of said transmission function;

defining a binary image pattern to be formed by said illumination system on said image plane;

generating a continuous mask function of continuously-varying phase which satisfies predetermined error criteria based on said coherent approximation of said transmission function and said binary image pattern;

transforming said mask function into a quadrature-phase mask function by dividing said continuously-varying phase into four phase levels;

generating said mask in accordance with said quadrature-phase mask function, said mask including a plurality of pixel regions wherein each pixel region has a transmittance corresponding to one of said four phase levels.

2. The method of claim 1 wherein said formulating step formulates said coherent approximation as a weighted superposition of transmission functions associated with one or more coherent illumination systems; and said step of generating a continuous mask function further includes the step of formulating an error function indicative of intensity difference between areas of said desired image pattern and corresponding areas of image patterns formed on the basis of said continuous mask function.

3. The method of claim 1, wherein said continuous mask function includes a real part and an imaginary part;

said transforming step includes transforming said real part of said continuous mask function into a first two-phase mask function having two phase levels and transforming said imaginary part of said continuous mask function into a second two-phase mask function having two phase levels; and said step of generating said mask includes generating a first mask in accordance with said first two-phase mask function and generating a second two-phase mask in accordance with said second two-phase mask function, said first mask including a plurality of first pixel regions wherein each first pixel region has a transmittance corresponding to one of said two phase levels, said second mask including a plurality of second pixel regions wherein each second pixel region has a transmittance corresponding to one of said two phase levels.

4. A systematic method of producing masks for use within a photolithographic illumination system characterized by a transmission function in which light is transmitted through non-opaque portions of said masks positioned in an object plane and in which an image is formed on an image plane, comprising the steps of:

formulating a coherent approximation of said transmission function;

defining a binary image pattern to be formed by said illumination system on said image plane;

generating a continuous mask function of continuously-varying phase which satisfies predetermined error criteria based on said coherent approximation of said transmission function and said binary image pattern, said continuous mask function including a real part and an imaginary part;

transforming said real part of said continuous mask function into a first two-phase mask function having two phase levels and transforming said imaginary part of said continuous mask function into a second two-phase mask function having two phase levels; and generating a first mask in accordance with said first two-phase mask function and generating a second two-phase mask in accordance with said second two-phase mask function, said first mask including a plurality of first pixel regions wherein each first pixel region has a transmittance corresponding to one of said two phase levels, said second mask including a plurality of second pixel regions wherein each second pixel region has a transmittance corresponding to one of said two phase levels.

5. The method of claim 4 wherein said step of generating a continuous mask function further includes the step of formulating an error function indicative of intensity difference between areas of said desired image pattern and corresponding areas of image patterns formed on the basis of said continuous mask function.

6. A system for producing masks for use within a photolithographic illumination system characterized by a transmission function in which light is transmitted through non-opaque portions of said masks positioned in an object plane and in which an image is formed on an image plane, comprising the steps of:

a computer system, including:

a computer memory in which is stored data representing a coherent approximation of said transmission function, and data representing a binary image pattern to be formed by said illumination system on said image plane;

a first mask generation program that generates a continuous mask function of continuously-varying phase which satisfies predetermined error criteria based on said coherent approximation of said transmission function and said binary image pattern; and a second mask generation program that transforms said mask function into a quadrature-phase mask function by dividing said continuously-varying phase into four phase levels; and mask fabrication equipment that generates said mask in accordance with said quadrature-phase mask function, said mask including a plurality of pixel regions wherein each pixel region has a transmittance corresponding to one of said four phase levels.

7. The system of claim 6 wherein said predetermined error criteria utilized by said first mask generation program include evaluation of an error function indicative of intensity difference between areas of said desired image pattern and corresponding areas of image patterns formed on the basis of said continuous mask function.

8. The system of claim 7, wherein said continuous mask function includes a real part and an imaginary part;

said second mask generation program transforms said real part of said continuous mask function into a first two-phase mask function having two phase levels and transforms said imaginary part of said continuous mask function into a second two-phase mask function having two phase levels; and said mask fabrication equipment generates a first mask in accordance with said first two-phase mask function and generates a second two-phase mask in accordance with said second two-phase mask function, said first mask including a plurality of first pixel regions wherein each first pixel region has a transmittance corresponding to one of said two phase levels, said second mask including a plurality of second pixel regions wherein each second pixel region has a transmittance corresponding to one of said two phase levels.

9. The system of claim 6, wherein said continuous mask function includes a real part and an imaginary part;

said second mask generation program transforms said real part of said continuous mask function into a first two-phase mask function having two phase levels and transforms said imaginary part of said continuous mask function into a second two-phase mask function having two phase levels; and said mask fabrication equipment generates a first mask in accordance with said first two-phase mask function and generates a second two-phase mask in accordance with said second two-phase mask function, said first mask including a plurality of first pixel regions wherein each first pixel region has a transmittance corresponding to one of said two phase levels, said second mask including a plurality of second pixel regions wherein each second pixel region has a transmittance corresponding to one of said two phase levels.

10. A system for producing masks for use within a photolithographic illumination system characterized by a transmission function in which light is transmitted through non-opaque portions of said masks positioned in an object plane and in which an image is formed on an image plane, comprising the steps of:

a computer system, including:

a computer memory in which is stored data representing a coherent approximation of said transmission function, and data representing a binary image pattern to be formed by said illumination system on said image plane;

a first mask generation program that generates a continuous mask function of continuously-varying phase which satisfies predetermined error criteria based on said coherent approximation of said transmission function and said binary image pattern, said continuous mask function including a real part and an imaginary part; and a second mask generation program that transforms said real part of said continuous mask function into a first two-phase mask function having two phase levels and transforming said imaginary part of said continuous mask function into a second two-phase mask function having two phase levels; and mask fabrication equipment that generates a first mask in accordance with said first two-phase mask function and generates a second two-phase mask in accordance with said second two-phase mask function, said first mask including a plurality of first pixel regions wherein each first pixel region has a transmittance corresponding to one of said two phase levels, said second mask including a plurality of second pixel regions wherein each second pixel region has a transmittance corresponding to one of said two phase levels.

11. The system of claim 10, wherein said predetermined error criteria utilized by said first mask generation program include evaluation of an error function indicative of intensity difference between areas of said desired image pattern and corresponding areas of image patterns formed on the basis of said continuous mask function.

12. A systematic method of producing a mask for use within a photolithographic illumination system characterized by a transmission function in which light is transmitted through non-opaque portions of said mask positioned in an object plane and in which an image is formed on an image plane, comprising the steps of:

formulating a coherent approximation of said transmission function;

defining a binary image pattern to be formed by said illumination system on said image plane;

generating a continuous mask function of continuously-varying phase which satisfies predetermined error criteria based on said coherent approximation of said transmission function and said binary image pattern;

transforming said mask function into a plural-phase mask function by dividing said continuously-varying phase into a plurality of phase levels;

generating said mask in accordance with said plural-phase mask function, said mask including a plurality of pixel regions wherein each pixel region has a transmittance corresponding to one of said plurality of phase levels.

13. The method of claim 12 wherein said step of generating a continuous mask function further includes the step of formulating an error function indicative of intensity difference between areas of said desired image pattern and corresponding areas of image patterns formed on the basis of said continuous mask function.

* * * * *